United States Patent [19]

Gaczi

[11] Patent Number: 4,766,006
[45] Date of Patent: Aug. 23, 1988

[54] LOW PRESSURE CHEMICAL VAPOR DEPOSITION OF METAL SILICIDE

[75] Inventor: Peter J. Gaczi, San Francisco, Calif.

[73] Assignee: Varian Associates, Inc., Palo Alto, Calif.

[21] Appl. No.: 863,622

[22] Filed: May 15, 1986

[51] Int. Cl.$^4$ .......................... B05D 3/06; B05D 5/12
[52] U.S. Cl. ........................................ 427/38; 427/39; 437/200
[58] Field of Search ........................ 427/39, 38, 95, 93

[56] References Cited

U.S. PATENT DOCUMENTS

| | | | |
|---|---|---|---|
| 4,359,490 | 11/1982 | Lehrer | 427/95 |
| 4,504,521 | 3/1985 | Widmer et al. | 427/85 |
| 4,557,943 | 12/1985 | Rosler et al. | 427/38 |
| 4,565,157 | 1/1986 | Brors et al. | 427/95 |
| 4,568,565 | 2/1986 | Gupta et al. | 427/53.1 |
| 4,608,271 | 8/1986 | Hieber et al. | 427/95 |
| 4,629,635 | 12/1986 | Brors | 427/95 |

OTHER PUBLICATIONS

Sinha, J. Vac. Sci. Technol., 19, 778, (1981), "Refractory Metal Silicides for VLSI Applications".
Crowder et al., EIII Trans. Elect. Dev., ED 26, 369, (1979), "MOSFET VLSI Tech: Part VII—Metal Silicide Interconnection Technology A Future Perspective".
D'Heurle, Proc. Electrochem. Soc., 1982, VSLI. Sci. Tech., pp. 194-212, "Material Properties of Silicides and Device Technology Implications".
Chow et al., IEEE Trans. Elect. Dev., ED-30, 1480, (1983), "Refractory Metal Silicides: Thin-Film Properties and Processing Technology".
Murarka, J. Vac. Sci. Technol., 17, 775, (1980), "Refractory Silicides for Integrated Circuits".
Inoue et al., J. Electrochem. Soc., 130, 1603, (1983), "Properties of Molybdenum Silicide Film Deposited by Chemical Vapor Deposition".
Brors et al., Solid State Technol., Apr. 1983, p. 183, "Properties of Low Pressure CVD Tungstem Silicide as Related to IC Process Requirements".
Saraswat et al., IEEE Trans. Elect. Dev., ED-30, 1497, (1983), "Properties of Low-Pressure CVD Tungsten Silicide for MOS VLSI Interconnections".
Brors et al., Proc. Electrochem. Soc., 1984, Chem. Vap. Depos., pp. 275-286.

Primary Examiner—John H. Newsome
Assistant Examiner—M. L. Padgett
Attorney, Agent, or Firm—Stanley Z. Cole; Gerald M. Fisher; Kenneth L. Warsh

[57] ABSTRACT

The invention relates to a process for the low pressure chemical vapor deposition (LPCVD) of metal silicide, especially molybdenum silicide, on a substrate at a low temperature. The walls of a LPCVD reactor which contains a heated pedestal for holding a substrate are cooled and the pedestal is heated so the substrate temperature reaches a desired level, depending on the metal silicide to be deposited. A metal halide and a silane or disilane are fed separately into the deposition chamber and mixed behind a small baffle plate at the entrance. The metal silicide is deposited on the substrate surface. It is preferred that the substrate be pre-treated with $H_2$ plasma before deposition.

36 Claims, 3 Drawing Sheets

LOW PRESSURE CHEMICAL VAPOR DEPOSITION OF METAL SILICIDE

BACKGROUND OF THE INVENTION

1. Field of the Invention

The present invention relates to a process for the low pressure chemical vapor deposition (LPCVD) of metal silicide, especially molybdenum silicide, on a substrate at a low temperature.

2. Description of the Prior Art

In the past, integrated circuit devices have made extensive use of polysilicon layers, both as self-aligned gates for field-effect transistors and for electrical interconnects between various components. Traditionally, deposited polycrystalline silicon has been doped with conventional donor or acceptor elements to reduce its resistivity into the one milliohm-centimeter range. Since the film thickness is limited to about 0.5 micron maximum to permit patterning and reasonable step coverage, sheet resistances less than about 20 ohms per square are difficult to obtain. Such a value is too high for complex, high-performance integrated circuits because ohmic drops become too high.

In VLSI (very large scale integration) technology, highly doped polysilicon gate-contact material in MOS (metal oxide semiconductor) devices is replaced with a layer combination exhibiting a lower resistance, for example, one composed of a 300 nm thick doped polysilicon layer and a 200 nm thick metal disilicide layer wherein the metal is molybdenum, tungsten or tantalum. Metal silicides have attracted increasing attention recently as possible interconnect material for semiconductor integrated circuits. In particular, bilayer composite films of metal silicide and polycrystalline silicon have been found to provide low resistance gate and interconnect layers for MOS circuits and to be otherwise compatible with current silicon gate technology.

Such structures are commonly termed "polycide" structures. The sheet resistance of polycide structures is generally an order of magnitude lower than that of a single layer structure of doped polycrystalline silicon alone. Polycide structures are utilized to achieve a high conductivity, gate-level metallization for MOS devices. More particularly, polycide structures are utilized as gate material and interconnects in structure such as very high speed integrated circuits (VHSIC). Polycide structures have been used, for example, as the gate material in insulated gate field effect transistor (IGFET) devices and other similar structures.

Polycide structures are conventionally produced by depositing undoped polycrystalline silicon by LPCVD, doping the polycrystalline silicon, e.g., by diffusion using phosphorus oxychloride, and then depositing the refractory metal silicide, e.g., tantalum silicide, thereover by co-sputtering from separate targets of metal and silicon. Subsequent annealing is required to obtain the desired low conductivity of the silicide layer.

Tungsten disilicide has received particular attention as a candidate for such applications because its electrical resistivity is among the lowest of the metal silicides. In addition, tungsten disilicide grows a passivating silicon oxide layer if a silicon source is available and it is not attacked by HF solutions. Films of tungsten disilicide have been formed by sintering films of tungsten metal deposited on silicon by evaporation, sputtering or chemical vapor deposition (CVD). They have also been formed by sintering mixed films of tungsten and silicon formed by co-evaporation, co-sputtering, or sputtering from a tungsten disilicide target.

In an improvement on these methods, U.S. Pat. No. 4,359,490 describes a LPCVD process for co-depositing a metal, such as tungsten, molybdenum, tantalum and niobium, and silicon onto a surface such as a semiconductor integrated circuit. In this process, a LPCVD reactor is maintained at 500°–700° C. and at a pressure of 0.1–0.3 torr. Conventional CVD purging steps are utilized and silane is introduced into the reactor to deposit a base layer of polysilicon on the desired surface. Then tantalum chloride, for example, is introduced and a tantalum silicide layer is deposited on the surface at a rate of 100–300 angstroms/min.

Molybdenum disilicide films have also been deposited by LPCVD. See, for example, Inoue et al., *J.Electrochem.Soc.* 130, 1603 (1983). This process utilizes a hot wall procedure at 670° C. The LPCVD of tungsten silicide has also been described by Brors et al., *Solid State Technol.*, April 1983, p. 183; Saraswat el al., *IEEE Trans.Elect.Dev.* ED-30, 1497 (1983) and Brors et al. *Proc. Electrochem.Soc.* 1984, Chem. Vap. Depos., p. 275–286. The depositions described by the Brors et al. references were conducted at 350°–450° C. in a cold wall procedure. The LPCVD technique is currently preferred because it offers superior step coverage (over the sputtering technique), which is essential for state-of-the-art sub-micron devices.

U.S. Pat. No. 4,504,521 describes a similar process, but first deposits a doped amphorous silicon layer before depositing the tantalum silicide layer. According to this patent, a smooth surface of $TaSi_2$ is deposited after annealing, which is not the case in U.S. Pat. No. 4,359,490.

An additional process for depositing a metal silicide has been described in U.S. Pat. No. 4,557,943. In this process, a film of titanium silicide which is substantially titanium disilicide is deposited by chemical vapor deposition by reacting a gaseous silicon species and a gaseous titanium species in a plasma. The preferred reactant species are silane ($SiH_4$) and titanium tetrachloride ($TiCL_4$) which are carried into a reaction chamber by an inert gaseous carrier such as argon. Since $SiH_4$ and $TiCl_4$ decompose at different temperatures, thermal decomposition is inadequate to produce films uniform composition and thickness over an extended reaction zone. In accordance with this invention, the decomposition reaction takes place in a plasma at relatively low temperature (450° C.) by alternating electrical field, by a process generally termed plasma-enhanced chemical vapor deposition (PECVD). After deposition, the material is annealed at 600°–700° C.

In addition to the above art, additional reference can be made to Sinha, *J.Vac. Sci.Technol.* 19, 778 (1981); d'Heurle, *Proc. Electrochem.Soc.* 1982, VLSI Sci. Tech., pp 194–212; Crowder et al., *IEEE Trans.Elect.Dev.* ED-26, 369 (1979); Chow et al., *IEEE Trans.Elect.Dev.* ED-30, 1480 (1983); and Murarka, *J.Vac.Sci. Technol.* 17, 775 (1980), for discussions of refractory metal silicides.

One disadvantage of prior art LPCVD processes is a relatively poor adhesion of the metal silicide layer to the surface of the substrate. Another disadvantage is that the "low" temperatures are still too high for use of lift-off techniques and/or conformal metallization on plastics or other temperature-intolerant materials without rapid thermal processing (non-RTP); and the temperatures are also too high, resulting in unacceptable redistribution of dopants in sub-micron structures. Some attempts have been made to deposit molybdenum silicide by LPCVD at 300°-400° C. but have been unsuccessful, apparently as a result of excessive gas phase pre-reaction and impurities in the $MoF_6$.

SUMMARY OF THE INVENTION

The present invention provides a low pressure chemical vapor deposition of a metal silicide at temperatures which are generally at least 100° C. below temperatures currently being used.

According to the present invention, the walls of a LPCVD reactor which contains a heated pedestal for holding a substrate are cooled, and the pedestal is heated so the substrate temperature reaches a desired level, depending on the metal silicide to be deposited. A metal halide and silane or disilane are fed separately into the deposition chamber and mixed behind a small baffle plate at the entrance. The metal silicide is deposited on the substrate surface. It is preferred that the substrate be pre-treated with $H_2$ plasma before deposition.

DETAILED DESCRIPTION OF THE INVENTION

Figure 1:
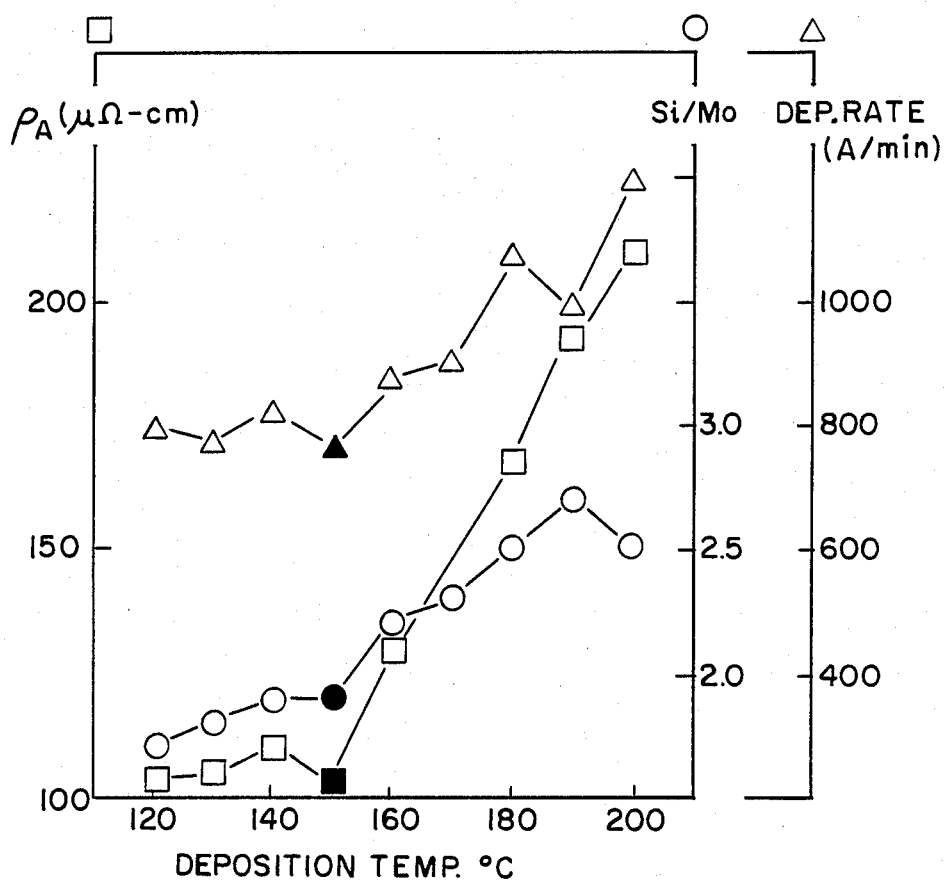
FIG. 1 shows RTP resistivity ($\mu\Omega$-cm), Si/Mo and depostion rate (angstroms/min) versus deposition temperature. Deposition conditions: 0.25 torr, 4.3 sccm $MoF_6$, 100 sccm $SiH_4$. Substrates: thermal oxide—shaded symbols; undoped polysilicon/oxide—open symbols.

The present invention is directed to a process for the LPCVD of a metal silicide on a substrate at reduced temperatures, i.e., temperatures at least 100° C. below conventional temperatures. Using the present process, it is possible to deposit a metal silicide on a substrate at temperatures ranging from 50°-450° C., depending on the metal and silicon sources, as discussed further below. Reduced temperature processing is important in that it (1) enables the use of lift-off techniques, (2) is less likely to redistribute dopants in sub-micron surfaces, (3) would enable the application of metal silicides to GaAs technology (in which it is desirable to avoid differential heat stress) as well as to plastics and other temperature-intolerant materials, and (4) does not affect aluminum if it is present in the substrate.

The substrate receiving the metal silicide layer may be any material conventionally used in the electronics industry. A preferred substrate is a single crystal silicon wafer. The substrate may be partially processed, e.g., doped, to provide regions of conductivity. The substrate may have its oxide layer stripped away prior to metal silicide deposition or may still have its oxide layer.

The substrate is placed in a conventional LPCVD reactor. The reactor contains a pedestal on which the substrate is placed. The pedestal is heated to the desired temperature, depending on the metal compound and silicon compound being used to form the metal silicide layer. The walls of the reactor are cooled either by simply blowing air on the outside walls of the reactor or actively cooling the reactor, such as through the use of a water jacket. The choice between active cooling or simple air cooling is dependent upon the temperature at which the deposition is to occur for the chosen reactants. A lower wall temperature is desired to avoid pre-reaction of the reactants. It has been found that a 50% decrease in deposition rate can occur at processing temperatures if the reactor walls are not cooled. It may also be desirable to cool the gas feed lines and chamber walls below room temperature for a chosen deposition temperature. It is preferred that the reactor be conditioned prior to actual depositions on the substrate. Conditioning can be performed by depositing a metal silicide coating on test substrates. The reactor is periodically cleaned, such as by a $NF_3$ plasma, to remove buildup of deposited metal silicide.

Once the substrate has been placed in the reactor the reactor pressure is reduced, typically to the base pressure of the LPCVD system. A pressure of from about 0.05-5 torr may be utilized. It is preferred to use a pressure of 0.2-0.3 torr. If high pressures are used, it may be necessary to utilize a diluent gas to avoid a gas phase reaction which results if higher concentrations of the reactants are present.

After the desired temperature and pressure conditions have been established, conventional initial CVD purging is preferably used to insure reactor cleanliness. In a preferred embodiment, the reactor is purged with $H_2$ using a pump and flow purge technique. After the rector has been purged, it is preferred to bake-out the reactor to remove any water. Although these steps may not be necessary, they are preferred to insure the production of quality products.

Prior to the introduction of the reactants into the reactor, it is preferred, although not necessary, that the wafer be pretreated by a $H_2$ plasma treatment. Suitable parameters include a 20-50 W, preferably 20 W, $H_2$ plasma treatment at 0.2 torr. The $H_2$ plasmsa treatment is desirable to clean the system and to rid the substrate surface of any water. The $H_2$ plasma treatment may enhance the adhesion of the metal silicide layer to the substrate.

The reactants are then fed into the reactor through separate feed lines. The reactants are mixed behind a small baffle plate at the entrance. The silicon reactant may be $SiH_4$ or $Si_2H_6$, and the metal reactant may be $MoF_6$, $WF_6$, $TaCl_5$ or $TiCl_4$. $MoF_6$ may be used with either $SiH_4$ or $Si_2H_6$, whereas the other metal reactants may only be used with $Si_2H_6$. Other combinations do not result in reduced deposition temperatures. The $SiH_4$ or $Si_2H_6$ is flowed into the reactor at the rate of 15-145 sccm. The flow rate is considered as the flow rate per wafer. The flow rate for $SiH_4$ or $Si_2H_6$ over this range is apparently not critical to the final product. The flow rate of the metal reactant is more critical. If the flow rate is over about 10 sccm, then a pre-reaction will occur. If the flow rate is under about 2 sccm, then the resistivity of the metal silicide coating becomes too high. Thus, the flow rate for the metal reactant should be from about 2 sccm to about 10 sccm. A standard dump is utilized to avoid a burst of the reactants in the reactor.

The deposition time is generally 2-15 minutes, depending on the desired thickness of the metal silicide layer. A typical deposition time of 4 minutes is used to obtain a 2500 angstrom metal silicide layer at a deposition rate of 700 angstroms/min. The metal silicide layer will preferably have a Si/metal (Si/Me) ratio of from about 1.7-2.3, if a silicon-based substrate is utilized. That is, the metal silicide has the formula $MeSi_x$, where $1.7 \leq X \leq 2.3$. If the substrate is GaAs or a temperature-intolerant material such as plastic, then the ratio can be less than 1.7. In this instance, the maximum ratio of 2.3.

The temperature to which the substrate is heated is dependent on the reactants which are utilized. If the reactants are $MoF_6$ and $SiH_4$, a temperature of about 90°-170° C., preferably 120°-170° C., can be used. In the most preferred embodiment, a temperature of 150° C. is utilized. If the reactants are $MoF_6$ and $Si_2H_6$, a temperature of about 40°-90° C. should be used. When $WF_6$ and $Si_2H_6$ are employed as the reactants, a temperature of about 180°-250° C. can be used. When $TiCl_4$ or $TaCl_6$ and $Si_2H_6$ are used as the reactants, a suitable temperature would be 350°-500° C., preferably 350°-400° C. The proper temperature is determined for each set of reactants by determining the Si/Me ratio of the film deposited at various temperatures and selecting the temperature range which yields the Si/Me ratio of less than 2.3, as discussed above.

The invention will be further described by reference to the following non-limiting examples. All temperatures expressed are in degrees Celsius.

EXAMPLE 1

$MoSi_x$ films were deposited on 4 inch wafers in an air-cooled fused silica bell jar. Wafers were placed on a resistance heated 6 inch fused silica pedestal and heated to 120°-350° C. Wafer temperatures were calibrated with three thermocouple junctions in contact with the top surface of a test wafer; observed temperature variations were ±10° C. or less over the wafer.

$SiH_4$ and $MoF_6$ had separate feed lines to the deposition chamber and were mixed behind a small baffle plate at the entrance. The $MoF_6$ flow was regulated by two needle valves in series and calibrated by filling a known volume. The $MoF_6$ bottle and valves were housed in a vented 29° C. thermostated cabinet. $MoF_6$ flows in the range from 0.5-10 sccm were reproducible to ±10%. $SiH_4$ flow was regulated with a 0-300 sccm mass flow controller. Deposition pressures ranged from 0.2-0.3 torr.

The deposition chamber was pumped with a 27 cfm corrosionresistant mechanical pump. Oil filters were changed after about 10 $\mu$m of depostion. Purging with $H_2$, pre-deposition bake-out, and minimizing the amount of vacuum system exposed to air during wafer unload/reload kept impurity gas partial pressures, including $H_2O$, below the 0.1% level. Reactant, product and impurity gases were monitored with a mass spectrometer. The bell jar and heater were periodically cleaned with a $NF_3$ plasma.

Rapid thermal processing (RTP) of the $MoSi_x$ films was performed in a lamp annealer for 30 seconds at 110° C. Si and Mo content were determined by Rutherford Backscattering (RBS); oxygen impurity was not detected and therefore less than 5%. Thicknesses obtained by black wax masking, 95% $HNO_3$+5% HF etch, and stylus measurement agreed with RBS results and were used to compute deposition rates. Step coverage was determined by SEM of cross sections.

The deposition temperature dependence of RTP resistivity, Si/Mo ratio and deposition rate is shown for the range 120°-200° C. in FIG. 1. All three quantities are approximately constant for temperatures at or below 150° C. and then increase in concert as the temperature is raised above 150° C. The reaction between $MoF_6$ and $SiH_4$ changes at 150° C. when more Si is incorporated into the film as the temperature is increased, resulting in increased deposition rate and resistivity.

Figure 2:
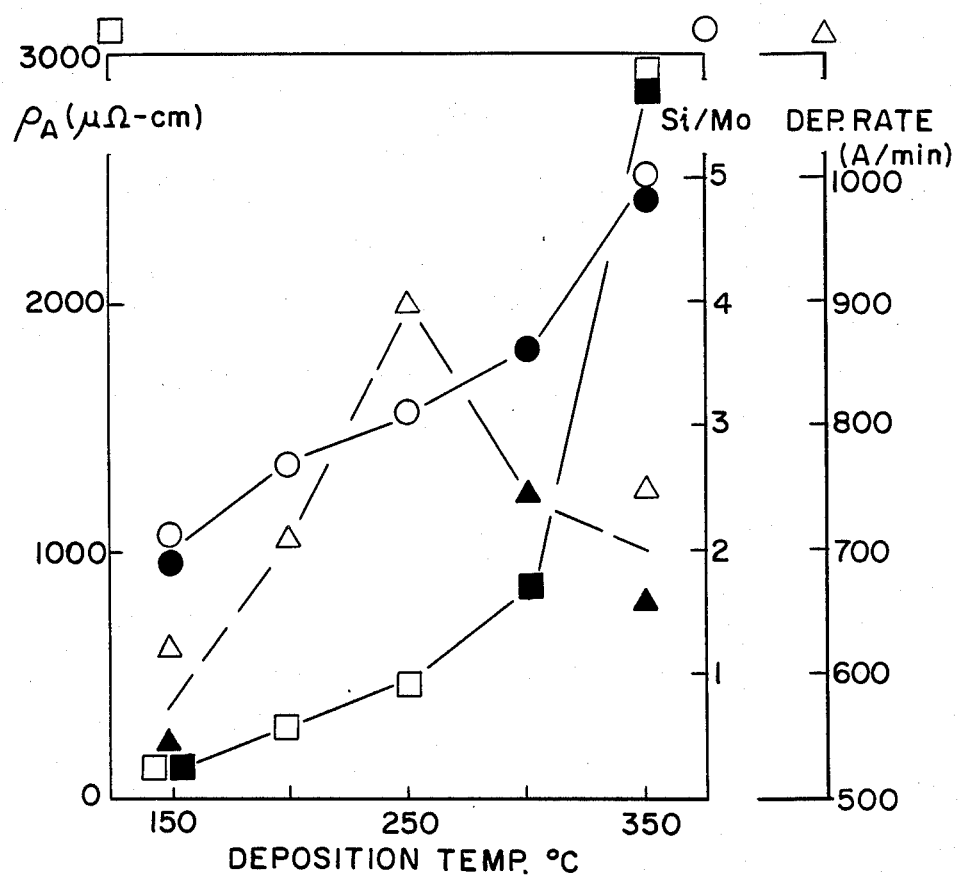
FIG. 2 shows RTP resistivity ($\mu\Omega$-cm), Si/Mo and deposition rate (angstroms/min) versus deposition temperature. Deposition conditions: 0.28 torr, 3.4 sccm $MoF_6$, 135 sccm $SiH_4$. Substrates: thermal oxide—shaded symbols; undoped polysilicon/oxide—open symbols.

With similar $MoF_6$ and $SiH_4$ flows, RTP resistivity, Si/Mo ratio and deposition rate show consistent increases as the temperature is increased over the range 150°-350° C. (FIG. 2). Deposition rate falls off above 250° C., however. This is probably due to reactant loss to gas phase nucleation and/or the observed deposition on the chamber walls.

Figure 3:
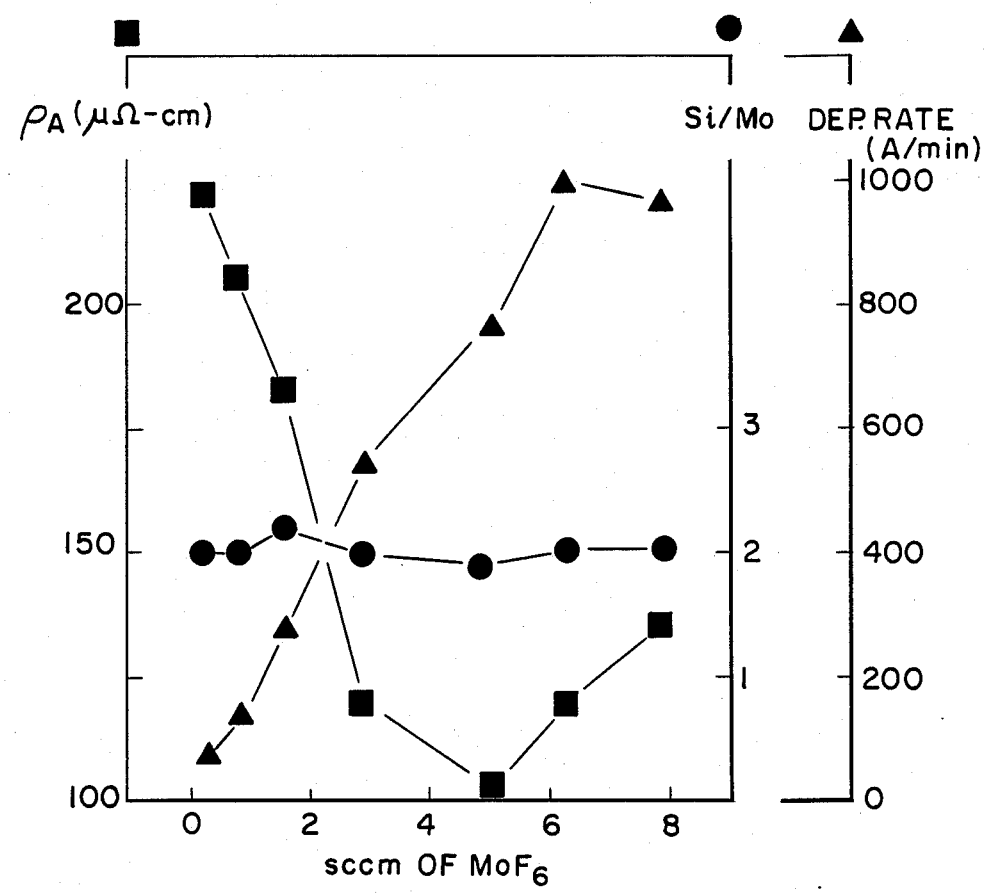
FIG. 3 shows RTP resistivity ($\mu\Omega$-cm), Si/Mo and deposition rate (angstroms/min) versus $MoF_6$ flow rate (sccm). Deposition conditions: 0.25 torr, 150° C., 100 sccm $SiH_4$. Substrates: thermal oxide.

$MoSi_x$ film properties as a function of $MoF_6$ flow at 150° C. are illustrated in FIG. 3. Deposition rate increases linearly with $MoF_6$ flow, but the fall-off at higher flows is probably due to gas phase or chamber wall losses. Practically, the same dependence of deposition rate on $MoF_6$ flow was observed at 250° C. In FIG. 3, RTP resistivity shows a minimum at 5 sccm $MoF_6$, but not because of changes in film composition. The RTP resistivity may be a function of deposition rate-correlated microstructural differences in as-deposited films.

Si/Mo ratio was determined to be fairly constant for a considerable range of $MoF_6$ flows (FIG. 3) and $SiH_4$ flows at 150° C. With $MoF_6$ flow in the range from 3-5 sccm and $SiH_4$ flow in the range from 15-135 sccm, Si/Mo was 2.0±0.1. Si/Mo ratio by RBS did not change significantly upon RTP (six samples). RTP resistivity at 150° C. was also fairly constant at about 120 $\mu\Omega$-cm for $MoF_6$ flows above 3 sccm. Data for 250° C. samples is less complete, but RTP resistivity shows a minimum as a function of $MoF_6$ flow similar to that depicted in FIG. 3. Furthermore, RTP resistivity is independent of $SiH_4$ flow at 150° C., but appears to be a moderately increasing function of $SiH_4$ flow at 250° C.

Film properties for poly/oxide and oxide coated Si wafers were quite similar. Fifteen samples, deposited under various conditions and temperatures in the range from 120°-300° C., were tape tested before and after RTP annealling. Included were six samples deposited on oxide at 150° C. with Si/Mo=1.9-2.0, and three samples deposited on poly/oxide at 120° C., 130° C. and 140° C. with respective Si/Mo=1.7, 1.8 and 1.9. One of the six 150° C. samples on oxide was the only tape test failure, but it passed after annealing. Samples were specular and RTP bulk resistivities were typically ten times smaller than as-deposited values.

EXAMPLE 2

This example describes one of the specific trials which followed the procedure of Example 1 and provided the data discussed in Example 1.

A 4 inch wafer having a poly/oxide coating was stripped for 1 minute in a 10:1 HF dip. The wafer was loaded into the quartz bell jar which was air cooled by blowing air on the exterior of the walls. The bell jar was purged with $H_2$ for 1 hour by evacuation, flowing in $H_2$, evacuation, etc. The wafer was then subjected to bake-out for 1 hour with a pedestal temperature of 140° C.

The wafer temperature was 150° C. A 20 minute H$_2$ plasma treatment was then performed at 40 W and 0.1 torr. MoF$_6$ and Si$_4$ were then flowed in the bell jar with a flow rate of 3.5 sccm and 45 sccm, respectively. Deposition temperatures were 141° C. and 150° C., respectively, for the pedestal and wafer. Deposition time was 10 minutes. The Si/Mo ratio of the deposited molybdenum silicide was determined to be 2.0. The deposition rate was 620 angstroms/min. The RTP resistivity of the film was 136 μΩ-cm.

EXAMPLE 3

Two samples were made at 150° C. with Si$_2$H$_6$ substituted for SiH$_4$. The molybdenum silicide film which was deposited had Si/Mo ratios of 3 and 4, and RTP resistivites of 430 and 1000 μΩ-cm. These samples correspond to the films produced at 250°-300° C. using SiH$_4$. Since the Si/Mo ratio and RTP resistivity were reduced for MoSi$_x$ films prepared using MoF$_6$ and SiH$_4$ by lowering the temperature, it is anticipated that a lower temperature would produce the desired Si/Mo ratios and RTP resistivity when MoSi$_x$ films are prepared using MoF$_6$ and Si$_2$H$_6$. A MoSi$_x$ film having a Si/Mo ratio of 1.7-2.3 is prepared at a deposition temperature from 75°-100° C. with active cooling of the chamber walls and gas feed lines.

GENERAL DISCUSSION

The reaction between the refractory metal and silicon in a cold wall system to produce MoSi$_x$ depends primarily on the metal compound flow and substrate temperature. Using MoF$_6$ and either SiH$_4$ or Si$_2$H$_6$, deposition temperatures can be utilized which are at least 100° C. lower than the WF$_6$ and SiH$_4$ cold wall system without loss in purity of the MoSi$_x$ film and without vacuum system attack. Similar results, i.e., deposition temperatures reduced by about 100° C., can be obtained using WF$_6$, TaCl$_5$ or TiCl$_4$ and Si$_2$H$_6$ as the reactant species.

The principal advantage of the MoF$_6$ and SiH$_4$ or Si$_2$H$_6$ process over the WF$_6$ and SiH$_4$ process is lower temperature. Application to lift-off, a patterning technique which eliminates an etch step, is conceivable. The lower temperature is also less likely to redistribute dopants in sub-micron structures. The latter advantage is also true for use of WF$_6$, TaCl$_5$ or TiCl$_4$ or Si$_2$H$_6$.

MoSi$_x$ could be deposited on plastics or other temperature-intolerant materials. The LPCVD technique yields better step coverage than physical vapor deposition (PVD) techniques, such as sputtering or evaporation. Therefore, LPCVD MoSi$_x$ offers an advantage over PVD metallizations on micron-sized (temperature-intolerant) structures. Scintering would likely be impractical for such applications, and some compromise of resistivity would be necessary. The results herein show that 120° C. films with x=1.7 have lower 900 μΩ-cm unscintered resistivity than 1000 μΩ-cm 150° C. films. It is possible that 100° C. films would be even "metal rich" and therefore, more conductive. It is also possible that local laser scintering would lower the resistivity and increase the usefulness of MoSi$_x$ as a "low temperature" conformal metallization.

A disadvantage of the MoSi$_x$ films is that they are half as conductive as WSi$_x$ films after scintering. MoSi$_x$ films with $1.7 \leq X \leq 2.0$ adhere to polysilicon after scintering, while analogous WSi$_x$ films do not, however. Superior adherence of MoSi$_x$ with x=2 on SiO$_2$ was obtained as well. The superior adherence may be due to less interfilm stress associated with the lower deposition temperature. Lower film stress and metal-rich film (100° C.) have potential application to GaAs technology, where rapid scintering may be acceptable.

The reaction of MoF$_6$ and SiH$_4$ to produce MoSi$_x$ is a viable process for VLSI metallization, yielding a tenfold increase in conductivity over doped polysilicon after RTP. Si/Me ratios of 2.1-2.2 are desired for refractory metal silicides to avoid abstraction of silicon from surrounding IC structures. A satisfactory Si/Mo ratio in MoSi$_x$ can be obtained with a substrate temperature of 160° C. At this temperature, one obtains specular films with 70-80% step coverage and 850 angstroms/min. deposition rate. Bulk resistivity of 120 μΩ-cm is twice that of WSi$_x$, but adhesion is superior. Furthermore, the process temperature is about 200° C. lower than that for WSi$_x$. This may enable application to lift-off techniques. Conformal metallization (non-RTP) on plastics or other temperature-intolerant materials could be deposited at temperatures as low as 120° C.

While the invention has been described in connection with specific embodiments thereof, it will be understood that it is capable of further modifications. This application is intended to cover any variation, uses or adaptations of the invention following, in general, the principles of the invention and including such departures from the present disclosure as come within known and customary practice within the art to which the invention pertains.

I claim:

1. A process for the low pressure chemical vapor deposition of a metal silicide film on a substrate at a reduced temperature, which comprises:
   (a) maintaining the substrate at a temperature of from about 40° C. to about 250° C. in a reactor whose walls are cooled, and
   (b) simultaneously introducing into the reactor a metal compound selected from the group consisting of MoF$_6$ and WF$_6$, and a silicon compound selected from the group consisting of SiH$_4$ and Si$_2$H$_6$, with the proviso that when the metal compound is WF$_6$, the silicon compound is Si$_2$H$_6$, such that a metal silicide film having a silicon:metal ratio of less than about 2.3 is deposited on said substrate.

2. The process of claim 1 wherein said substrate is subjected to a H$_2$ plasma treatment in the reactor prior to step (b).

3. The process of claim 1 wherein the metal compound is MoF$_6$, the silicon compound is SiH$_4$, and the temperature is from about 90° C. to about 170° C.

4. The process of claim 3 wherein said temperature is from about 120° C. to about 160° C.

5. The process of claim 3 wherein said substrate is subjected to a H$_2$ plasma treatment in the reactor prior to step (b).

6. The process of claim 4 wherein said substrate is subjected to a H$_2$ plasma treatment in the reactor prior to step (b).

7. The process of claim 1 wherein the metal compound is MoF$_6$, the silicon compound is Si$_2$H$_6$, and the temperature is from about 40° C. to about 90° C.

8. The process of claim 7 wherein said substrate is subjected to a H$_2$ plasma treatment in the reactor prior to step (b).

9. The process of claim 1 wherein the metal compound is WF$_6$ and the temperature is from about 180° C. to about 250° C.

10. The process of claim 9 wherein said substrate is subjected to a $H_2$ plasma treatment in the reactor prior to step (b).

11. The process of claim 1 wherein the substrate comprises at least one wafer and the metal compound is introduced into the reactor with a flow rate per wafer of from about 2 sccm to about 10 sccm and the silicon compound is introduced into the reactor with a flow rate of from about 15 sccm to about 145 sccm.

12. The process of claim 1 wherein the silicon: metal ratio is from about 1.7 to about 2.3.

13. A process for the low pressure chemical vapor deposition of a molybdenum silicide film on a substrate at a reduced temperature, which comprises:
    (a) maintaining the substrate comprising at least one wafer at a temperature of from about 40° C. to about 170° C. in a reactor whose walls are cooled, and
    (b) simultaneously introducing into the reactor $MoF_6$ with a flow rate from about 2 sccm to about 10 sccm per wafer and a silicon compound selected from the group consisting of $SiH_4$ and $Si_2H_6$ with a flow rate of from about 15 sccm to about 145 sccm, such that a molybdenum silicide film having a Si:Mo ratio of less than about 2.3 is deposited on said substrate.

14. The process of claim 13 wherein said silicon compound is $SiH_4$ and the temperature is from about 90° C. to about 170° C.

15. The process of claim 14 wherein said temperature is from about 120° C. to about 160° C.

16. The process of claim 13 wherein said silicon compound is $Si_2H_6$ and the temperature is from about 40° C. to about 90° C.

17. The process of claim 13 wherein said substrate is subjected to a $H_2$ plasma treatment in the reactor prior to step (b).

18. The process of claim 14 wherein said substrate is subjected to a $H_2$ plasma treatment in the reactor prior to step (b).

19. The process of claim 15 wherein said substrate is subjected to a $H_2$ plasma treatment in the reactor prior to step (b).

20. The process of claim 16 wherein said substrate is subjected to a $H_2$ plasma treatment in the reactor prior to step (b).

21. The process of claim 13 wherein the Si:Mo ratio is from about 1.7 to about 2.3.

22. A process for the low pressure chemical vapor deposition of a molybdenum silicide film on a substrate at a reduced temperature, which comprises:
    (a) maintaining the substrate comprising at least one wafer at a temperature of from about 90° C. to about 170° C. in a reactor whose walls are cooled, and
    (b) simultaneously introducing into the reactor $MoF_6$ with a flow rate from about 2 sccm to about 10 sccm per wafer and $SiH_4$ with a flow rate of from about 15 sccm to about 145 sccm, such that a molybdenum silicide film having a Si:Mo ratio of less than about 2.3 is deposited on said substrate.

23. The process of claim 22 wherein said temperature is from about 120° C. to about 160° C.

24. The process of claim 22 wherein said substrate is subject to a $H_2$ plasma treatment in the reactor prior to step (b).

25. The process of claim 23 wherein said substrate is subjected to a $H_2$ plasma treatment in the reactor prior to step (b).

26. The process of claim 22 wherein the Si:Mo ratio is from about 1.7 to about 2.3.

27. The process of claim 23 wherein the Si:Mo ratio is from about 1.7 to about 2.3.

28. A process for the low pressure chemical vapor deposition of a molybdenum silicide film on a substrate at a reduced temperature, which comprises:
    (a) maintaining the substrate comprising at least one wafer at a temperature of from about 90° C. to about 170° C. in a reactor whose walls are cooled,
    (b) treating said substrate with $H_2$ plasma, and
    (c) simultaneously introducing into the reactor $MoF_6$ with a flow rate from about 2 sccm to about 10 sccm per wafer and $SiH_4$ with a flow rate of from about 15 sccm to about 145 sccm, such that a molybdenum silicide film having a Si:Mo ratio of less than about 2.3 is deposited on said substrate.

29. The process of claim 28 wherein said temperature is from about 120° C. to about 160° C.

30. The process of claim 28 wherein the reactor is purged prior to step (b).

31. The process of claim 28 wherein the Si:Mo ratio is from about 1.7 to about 2.3.

32. The process of claim 29 wherein the Si:Mo ratio is from about 1.7 to about 2.3.

33. A process for the low pressure chemical vapor deposition of a metal silicide film on a substrate at a reduced temperature, which comprises:
    (a) maintaining the substrate at a temperature of from about 350° C. to about 400° C. in a reactor whose walls are cooled, and
    (b) simultaneously introducing into the reactor $Si_2H_6$ and a metal compound selected from the group consisting of $TaCl_5$ and $TiCl_4$, such that a metal silicide film having a silicon: metal ratio of less than about 2.3 is deposited on said substrate.

34. The process of claim 33 wherein said substrate is subjected to a $H_2$ plasma treatment in the reactor prior to step (b).

35. The process of claim 33 wherein the substrate comprises at least one wafer and the metal compound is introduced into the reactor with a flow rate per wafer of from about 2 sccm to about 10 sccm and the silicon compound is introduced into the reactor with a flow rate of from about 15 sccm to about 145 sccm.

36. The process of claim 33 wherein the silicon: metal ratio is from about 1.7 to about 2.3.

* * * * *